May 8, 1962 REONA EZAKI ET AL 3,033,714

DIODE TYPE SEMICONDUCTOR DEVICE

Filed May 8, 1958

INVENTORS
Reona Ezaki
BY Yuriko Kurose
Hill, Sherman, Meroni, Gross & Simpson ATTYS.

United States Patent Office 3,033,714

Patented May 8, 1962

3,033,714

DIODE TYPE SEMICONDUCTOR DEVICE

Reona Ezaki, Tokyo, and Yuriko Kurose, Kamakura-shi, Japan, assignors to Sony Corporation, Tokyo, Japan, a corporation of Japan Filed May 8, 1958, Ser. No. 733,994
Claims priority, application Japan Sept. 28, 1957
7 Claims. (Cl. 148—33)

This invention relates to a semiconductor device and more particularly to a diode type semiconductor device.

p-n Junctions of germanium, silicon or other semiconductor materials have superior rectification effect so that such a semiconductor device has been used as a rectifier. The rectification characteristics of such a diode has satisfactorily been explained by Shockley's theory. That is, if the p-type region is maintained positive potential with respect to the n-type region, the minority carriers are injected so that the resistance of the diode becomes low. On the contrary, if the polarity of the electrodes is reversed, the resistance of the diode becomes very high to permit merely to pass the saturated current. Moreover, if the reverse voltage is increased, owing to a strong electric field in the space charge layer, electron multiplication or field emission of electrons occur to cause the so-called break-down, whereby the resistance in the reverse direction is appreciably decreased. The reverse breakdown voltage of the diode is mainly decided by the impurity concentration in the semiconductor. In most cases, diodes which have the impurity concentration of less than $10^{-7}$ cm.$^{-3}$ in the high resistivity side or the reverse breakdown voltage of at least more than 1 volt have actually been used.

In accordance with this invention, the p-n junction contains the impurity concentration from $10^{18}$ cm.$^{-3}$ to $10^{20}$ cm.$^{-3}$ in the high resistivity side of which the reverse direction is more conductive than the forward.

The impurity aforesaid means doner type impurity in n-type region and accepter type impurity in p-type region. The reverse direction means the direction in which the plus potential is applied to the n-type region with respect to the p-type region. The forward direction, on the contrary, means the direction in which the plus potential is applied to the p-type region with respect to the n-type region.

One object of this invention is to provide a diode type semiconductor device in which characteristic in the reverse direction is substantially the same as that in the forward direction so as to be the symmetrical rectification characteristics.

Another object of this invention is to provide a diode type semiconductor device which has a negative resistance in the positive voltage of the range from about 0.03 volt to about 0.2 volt.

A further object of this invention is to provide a diode type semiconductor device which has no transit and no minority carrier storage time and is independent of ambient gas and light incident and is insensitive to temperature change.

A still further object of this invention is to provide a diode type semiconductor device which can be available without depending upon frequencies to be used.

Other objects, features and advantages of this invention will be more fully apparent from the following detailed description taken in connection with the accompanying drawings, in which.

Figure 1:
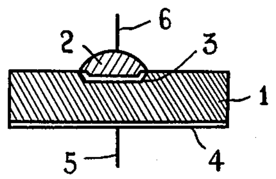
FIG. 1 is a diagrammatical sectional view of a diode type semiconductor device according to this invention.

A diode type semiconductor device according to this invention is made by the alloying technique so that the construction of the diode can be diagrammatically shown in FIG. 1. That is, the p-n junction of the diode is formed between a recrystalized germanium piece 3 and a p-type base germanium piece 1. 2 is an alloy metal containing a donor impurity and indium containing phosphorus was used as this metal in an experiment. 4 is the base metal; 5 is a lead wire for the p-type side and 6 a lead wire for the n-type side. It can be supposed that the impurity concentration in the n-type recrystalized germanium piece will be $10^{19}$ cm.$^{-3}$ or more.

The heat treating temperature in the alloying techniques is usually 500° C. to 700° C. but the current voltage characteristic of the diode varies appreciably according to the treating temperature.

In FIGS. 2 to 5, abscissa shows the plus voltage which is applied to the p-type side with respect to the n-type side. This is corresponding to the so-called forward direction in an ordinary p-n junction.

In every specimen, it will be recognized at the voltage more than about 0.3 volt in this direction that the current coincides quantitatively with the ordinary rectification equation $$I=I_S\left(\exp\left(\frac{qV}{kT}\right)-1\right) \qquad (1)$$

where $q$=electronic charge
$k$=Boltzmann's constant
$T$=temperature

According to this invention a rectifier made by using germanium has particular advantages below about 0.2 volt in the forward direction and also in the reverse direction.

Some embodiments of germanium diodes according to this invention are as follows:

p-Type germanium having the specific resistivity less than 0.01 ohm-cm. or the acceptor concentration more than $10^{18}$ cm.$^{-3}$ is used and p-n junction is formed thereon by the alloying techniques.

Figure 2:
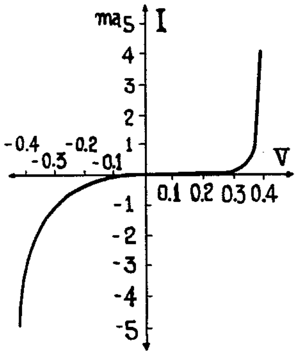
FIGS. 2 to 4 illustrate various characteristic curves of a diode type semiconductor device according to this invention.
Figure 3:
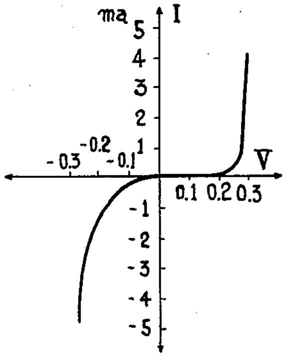
Figure 4:
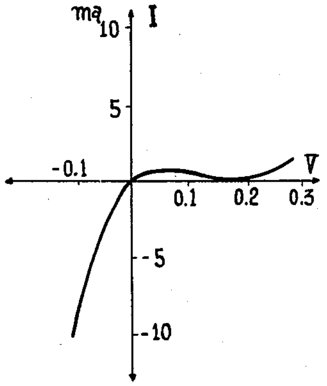

The various current voltage characteristics as shown in FIGS. 2, 3 and 4 are obtained according to the impurity concentration.

Namely, FIG. 2 shows the characteristic curve of the diode type semiconductor device, the impurity concentration of the p-type region of which is about $1\times10^{18}$ cm.$^{-3}$.

FIG. 3 shows the characteristic curve of the semiconductor device, the impurity concentration of the p-type region of which is about $2\times10^{18}$ cm.$^{-3}$.

Figure 5:
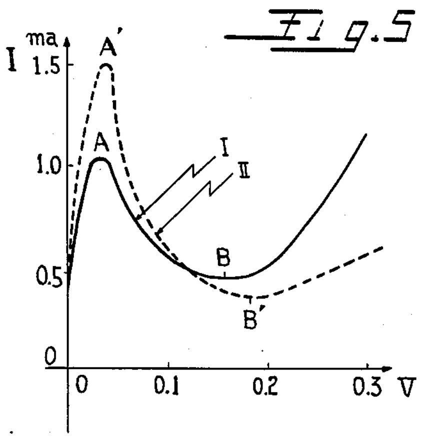
FIG. 5 shows curves illustrating the negative resistance characteristic of a diode according to this invention.

FIGS. 4 and 5 respectively show characteristic curve of a semiconductor device, the impurity concentration of the p-type region of which is $10^{19}$ cm.$^{-3}$.

From the above characteristic curve shown in the drawings the following advantages will be apparent:

(1) The specimen shown in FIG. 2 has substantially the same characteristic in the reverse direction as that in the forward.

The current in the reverse direction is mainly based upon the internal field emission.

(2) The specimen shown in FIG. 3 has lower resistance in the reverse direction than that in the forward.

This is because of the fact that the increased impurity concentration is increased to reduce the width of the p-n junction, thereby urging larger amount of the internal field emission current.

(3) The specimen shown in FIGS. 4 and 5 has not only lower resistance in the reverse direction than that in the forward but also has the dynatrontype negative resistance, in the forward, over the voltage range from about 0.03 to about 0.2 volt. The curve 1 in FIG. 5 is plotted at the temperature of 25° C. and the curve 11 at the temperature of −75° C. Such a tendency of the negative resistance will be seen in the case that the junction is made by alloying technique using germanium of the impurity concentration of $5\times10^{18}$ cm.$^{-3}$ to $2\times10^{18}$ cm.$^{-3}$. In this case, the transition region width of the p-n junction decreases to the order of $2\times10^{-6}$ cm. and it must be supposed that the built-in field will cause the internal field emission even in the case of no applied voltage. Accordingly, the internal field emission current will be seen not only in the reverse direction but also at a low voltage even in the forward.

Experiments show that a satisfactory p-n junction can not be obtained by the alloying technique of other techniques in the case of using the impurity concentration of more than $10^{20}$ cm.$^{-3}$. The similar semiconductor devices as shown in FIGS. 2 to 5 can be obtained, according to the impurity concentration, by the alloying technique using indium to n-type germanium containing the donor impurity than $10^{18}$ cm.$^{-3}$.

It will be understood that semiconductor devices having analogous characteristics can be obtained by using other semiconductors than germanium and silicon.

The operating mechanism of the diode type semiconductor device according to this invention is not made by diffusion or drift of the minority carrier as known heretofore so that the negative resistance of the diode according to this invention is fundamentarily different from the negative resistance device based upon the transistor action and therefore has various advantages. That is, the diode of this invention has no appreciable change in characteristics by the temperature change and light beam and also shows good frequency response in spite of having a comparatively large capacitance.

The diode type semiconductor device according to this invention has the characteristics as referred to in FIGS. 4 and 5 so that it will be understood that the diode can be used as an oscillator by connecting an oscillation circuit thereto and that the diode with an adequate connection can operate as a relaxation oscillator. It is also apparent that the diode of this invetnion is adapted as a switching element owing to the N-shape negative resistance.

Especially, it is one of the advantages of this diode that it can operate in the stable condition at a comparatively small electric power.

Figure 6:
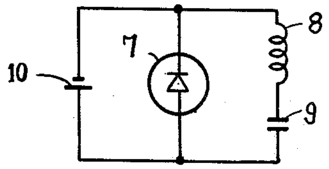
FIG. 6 shows a connection diagram of an oscillation circuit, by way of example, showing how to utilize a diode according to this invention.

FIG. 6 shows a connection diagram of an oscillator, by way of example, using a diode type semiconductor device according to this invention. That is, parallel to the diode 7 according to this invention is connected a series circuit composing of an inductance coil 8 and a capacitor 9. 10 is a direct current source.

Figure 7:
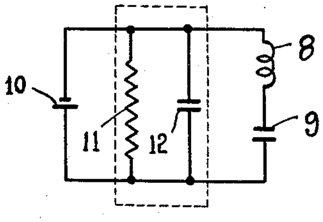
FIG. 7 is the equivalent circuit of the oscillation circuit shown in FIG. 6.

FIG. 7 shows an equivalent circuit of the oscillation circuit shown in FIG. 6. The diode 7 according to this invention is illustrated by the circuit in the dotted line. That is, the diode may be considered as a parallel circuit composing of the negative resistance 11 and the capacitor 12 surrounded by the dotted line.

The diode type semiconductor device according to this invention is concluded to have the following advantages:

(1) The diode will operate at a very small electric power.

(2) The diode can be manufactured easily and cheaply.

(3) Oscillators using the diodes can easily oscillate at a comparatively higher frequency, for example as 20 mc./s.

(4) The diode does not depend upon the temperature in use as the minority carrier is not used.

While we have explained a particular embodiment of our invention, it will be understood, of course, that we do not wish to be limited thereto since many modifications may be made and we, therefore, contemplate by the appended claims to cover any such modifications as within the spirit and scope of our invention.

What is claimed is:

1. An electronic device including a highly doped p-n junction formed by adjacent portions of semi-conductor materials oppositely doped, one portion of which has an impurity concentration of $2\times10^{18}$ to $10^{20}$ per cubic centimeter and the other oppositely doped portion of which has an impurity concentration in excess of $10^{19}$ per cubic centimeter and having a junction width of about 200 angstroms or less.

2. An electronic device comprising a p-n junction formed by adjacent semi-conductor portions oppositely doped to respective donor and acceptor type impurity concentrations in which one portion is doped in the range of $2\times10^{18}$ to $10^{20}$ per cubic centimeter and the other portion is doped to an impurity concentration in excess of said one portion and having a junction width of about 200 angstroms or less.

3. An electronic device comprising a p-n junction formed by adjacent semi-conductor portions oppositely doped to respective donor and acceptor type impurity concentrations in which one portion is doped in the range of $10^{19}$ to $10^{20}$ per cubic centimeter and the other portion is doped to an impurity concentration at least as great as said one portion and having a junction width of about 200 angstroms or less.

4. An electronic device including a highly doped p-n junction formed of semi-conductor type material having one portion thereof of higher resistivity and lower impurity concentration than the remaining portion thereof, said one portion having a resistivity of about .01 ohm centimeter or less with an impurity concentration of $2\times10^{18}$ to $10^{20}$ per cubic centimeter and having a transition region width of about 200 angstroms or less.

5. An alloyed p-n junction in semi-conductor material comprising a first body of semi-conductor material having an impurity concentration of about $2\times10^{18}$ to $10^{20}$ per cubic centimeter and a second body of semi-conductor material having an impurity concentration in excess of $10^{19}$ per cubic centimeter with a resistivity lower than the resistivity of the first body and having a transition region width of about 200 angstroms or less.

6. An electronic device including a p-n junction having a transition region width of about 200 angstroms or less formed by adjacent semi-conductor portions oppositely doped and in which the semi-conductor portions on opposite sides of said p-n junction are doped to respective donor and acceptor type impurity concentrations in amounts of $2\times10^{18}$ per cubic centimeter or greater.

7. An electronic device including a p-n junction having a transition region width of about 200 angstroms or less formed by adjacent semi-conductor portions oppositely doped and in which the side of the junction formed of the semi-conductor portion having the higher resistivity of the two sides has an impurity concentration in an amount in the range of $2\times10^{18}$ to $10^{20}$ per cubic centimeter and the other side has a greater impurity concentration.

References Cited in the file of this patent

UNITED STATES PATENTS

| | | |
|---|---|---|
| 2,505,633 | Whaley | Apr. 25, 1950 |
| 2,524,035 | Bardeen et al. | Oct. 3, 1950 |
| 2,567,970 | Scaff et al. | Sept. 18, 1951 |
| 2,744,970 | Shockley | May 8, 1956 |

(Other references on following page)

UNITED STATES PATENTS

| | | |
|---|---|---|
| 2,754,431 | Johnson | July 10, 1956 |
| 2,790,037 | Shockley | Apr. 23, 1957 |
| 2,843,516 | Herlet | July 15, 1958 |
| 2,870,052 | Rittmann | Jan. 20, 1959 |
| 2,890,976 | Lehovec | June 16, 1959 |

FOREIGN PATENTS

| | | |
|---|---|---|
| 707,008 | Great Britain | Apr. 17, 1954 |

OTHER REFERENCES

Johnson and McKay: Physical Review, vol. 93, No. 4, February 15, 1954, pages 668 to 672.

UNITED STATES PATENT OFFICE

CERTIFICATE OF CORRECTION

Patent No. 3,033,714

May 8, 1962

Reona Ezaki et al.

It is hereby certified that error appears in the above numbered patent requiring correction and that the said Letters Patent should read as corrected below.

Column 1, line 38, for "doner" read -- donor --; colum 3, line 27, after "impurity" insert -- of more --; line 48, for "invetnion" read -- invention --.

Signed and sealed this 2nd day of October 1962.

(SEAL)
Attest:

ERNEST W. SWIDER
Attesting Officer

DAVID L. LADD
Commissioner of Patents